United States Patent

Copeland

[15] 3,649,932

[45] Mar. 14, 1972

[54] MICROPHONE COMPRISING LSA OSCILLATOR

[72] Inventor: John A. Copeland, Gillette, N.J.

[22] Filed: May 6, 1970

[21] Appl. No.: 47,929

[52] U.S. Cl. ....................332/2, 179/1 R, 331/65, 331/107 G, 332/52

[51] Int. Cl. ....................H03c 1/46

[58] Field of Search ....................332/2, 52; 331/107 G, 65; 179/1

[56] References Cited

UNITED STATES PATENTS

| | | | |
|---|---|---|---|
| 1,585,018 | 5/1926 | Casper et al. | 179/1 |
| 1,755,739 | 4/1930 | Kositzky | 332/2 |
| 3,339,153 | 8/1967 | Hakki | 331/107 G |
| 3,414,841 | 12/1968 | Copeland | 331/107 G |
| 3,422,289 | 1/1969 | Atalla et al. | 331/107 G X |

*Primary Examiner*—Alfred L. Brody
*Attorney*—R. J. Guenther and Arthur J. Torsiglieri

[57] ABSTRACT

In one embodiment, an input signal is applied to an LSA oscillator circuit where it mixes with the oscillatory frequency $f_{LSA}$ to give a difference frequency $f_a$ that is amplified. In another embodiment, a signal of frequency $f_a$ applied to an LSA oscillator modulates the oscillatory output frequency. In another embodiment, an input frequency $f_a$ mixes with the oscillator frequency to give an amplified sum frequency. In all the above embodiments, $f_a$ conforms to the relationship $$f_a \leq \frac{f_{LSA}}{Q},$$

where $Q$ is the quality factor of the oscillator resonance circuit. A simple Doppler-effect radar is disclosed in which an LSA oscillator provides an output transmitted frequency and also detects and amplifies input frequency shifts indicative of the velocity of a target. The amplitude modulation phenomenon can be employed in a microphone in which a diaphragm is used to vary the quality factor $Q$ of the LSA oscillator resonant circuit.

4 Claims, 11 Drawing Figures

INVENTOR
J. A. COPELAND III
BY
Roderick B. Anderson
ATTORNEY

MICROPHONE COMPRISING LSA OSCILLATOR

Cross-Reference to Related Application

This application is a divisional of the parent application of J. A. Copeland III, Ser. No. 700,403, filed Jan. 25, 1968, and assigned to Bell Telephone Laboratories, Incorporated.

BACKGROUND OF THE INVENTION

The structure and operation of two-valley devices also known as bulk-effect devices, are described in detail in a series of papers in the Jan. 1966 issue of the *IEEE Transactions on Electron Devices*, Vol. ED-13, No. 1. As is set forth in these papers, a negative resistance can be obtained from a bulk semiconductor wafer of substantially homogeneous constituency having two energy band minimal within the conduction band which are separated by only a small energy difference. By establishing a suitably high electric field across opposite ohmic contacts of the semiconductor wafer, oscillations can be induced which result from the formation of discrete regions of high electric field intensity and corresponding space-charge accumulation, called domains, that travel from the negative to the positive contact at approximately the carrier drift velocity. A characteristic of the two-valley semiconductor material is that it presents a negative differential resistance to internal currents in regions of high electric field intensity. Hence, the electric field intensity of the domain grows as it travels toward the positive electrode.

Oscillators which operate according to this principle were first described in the paper "Instabilities of Current in III-V Semiconductors,"by J. B. Gunn, *IBM Journal*, Apr. 1964, and are now generally known as Gunn oscillators. The domains are formed successively which results in an oscillation frequency that is approximately equal to the carrier drift velocity divided by the wafer length. Since the oscillation frequency is a function of length, Gunn oscillators are inherently frequency and power limited; as the sample length is reduced to give higher frequency, the attainable power decreases.

The copending patent application of J. A. Copeland III, Ser. No. 564,081, filed July 11, 1966, and assigned to Bell Telephone Laboratories, Incorporated, and the paper by J. A. Copeland III, "A New Mode of Operation for Bulk Negative Resistance Oscillators," Proceedings of the IEEE, Oct. 1966, pages 1479–1480, describe how a new mode of oscillation, called the LSA mode (for Limited Space-charge Accumulation), can be induced in two-valley devices. This new mode of oscillation is not dependent on the formation of traveling domains, its frequency is not dependent on wafer length, and as a result, the oscillator does not have the frequency and power limitations of the Gunn oscillator. The LSA mode oscillator includes a two-valley semiconductor diode, a resonant circuit, and a load, the various parameters of which are adjusted such that the electric field intensity within the diode alternates between a high value at which negative resistance occurs, and a lower value at which the diode displays a positive resistance. By appropriately adjusting the duration of electric field excursions into the positive and negative regions of the diode, one can prevent the formation of the traveling domains responsible for Gunn-mode oscillation, while still obtaining the net negative resistance required for sustained oscillations.

The LSA mode oscillator is a particularly significant invention because it generates, at usefully high power levels, higher frequencies than other solid state sources and does not have the various drawbacks such as instability, high noise level, bulk, and power consumption that characterize microwave tube oscillators such as the klystron. It therefore offers the possibility of practical communication systems at higher microwave frequencies than those presently used. However, certain presently used microwave components such as modulators and crystal detectors are incapable of operating efficiently or of operating at all at some of these frequencies, particularly frequencies in the millimeter wavelength region.

SUMMARY OF THE INVENTION

I have found that while the LSA oscillator is oscillating, it presents a negative resistance to voltages applied across the diodes which have a sufficiently low frequency to permit oscillatory energy in the resonant circuit to change in amplitude during each cycle of the applied voltage. This condition implies a limiting relationship of the applied frequency $f_a$, the LSA oscillatory frequency $f_{LSA}$, and the quality factor $Q$ of the resonant circuit, which is a measure of the circuit energy storage capability. The limiting relationship can be approximated as $$f_a \lesssim \frac{f_{LSA}}{Q}. \qquad (1)$$

Hence, if a frequency $f_a$ is applied to the diode, it will be amplified by the diode negative resistance.

In an embodiment in which the LSA oscillatory circuit is used as a local oscillator, mixer, and amplifier, an input signal at a frequency equal to $f_{LSA} \pm f_a$ is applied to the circuit. It can be shown that the diode is inherently nonlinear, which results in mixing of the input and oscillatory frequencies to give a difference frequency $f_a$. With the difference frequency conforming to relationship (1), it is amplified by the diode negative resistance.

This feature can be used to provide a simple and inexpensive Doppler-effect radar in which an LSA oscillator generates a transmitted frequency and also detects and amplifies frequency deviations of the reflected signal. The difference of the output frequency and the incoming frequency is indicative of the velocity of the moving target. While the transmitted frequency is in the microwave range, complicated microwave components such as circulators and isolators are not required.

In another embodiment, a varying signal having a frequency $f_a$ is used to amplitude modulate the *LSA* oscillation frequency. Because the frequency $f_a$ is low enough to permit amplitude adjustment during each cycle by the oscillation frequency, it is effective in modulating the oscillation frequency, and further, the modulating frequency is amplified due to the diode negative resistance.

The amplitude modulation feature can be used to provide a simple and efficient microphone. A plunger attached to a sound-responsive diaphragm extends into the cavity resonator of an *LSA* oscillator and varies the circuit quality factor $Q$ of the oscillator at the incoming sound frequency. This in turn amplitude modulates the oscillatory output, thus efficiently converting sound energy to electrical energy.

In still another embodiment, the frequency $f_a$ is applied and the oscillation output is filtered to retrieve the sum frequency $f_a + f_{LSA}$. This embodiment is an efficient local oscillator, amplifier, and up-converter mixer.

DRAWING

These and other objects, features and advantages of the invention will be better understood from a consideration of the following detailed description taken in conjunction with the accompanying drawing in which.

DETAILED DESCRIPTION

Figure 1:
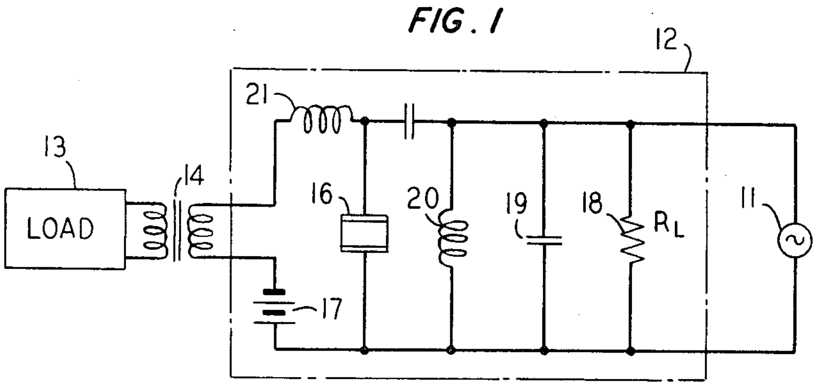
FIG. 1 is a schematic drawing of an oscillator, mixer, and amplifier in accordance with one embodiment of the invention.

Referring now to FIG. 1 there is shown schematically an oscillator, mixer, and amplifier circuit comprising a signal source 11, an *LSA* oscillator 12, and a load 13 connected to the oscillator by a transformer 14. The *LSA* oscillator circuit comprises a semiconductor diode 16 connected to a d-c voltage source 17, a load resistance 18, and a resonant tank circuit comprising a capacitance 19 and an inductance 20. The diode 16 comprises a sample of two-valley semiconductor material included between substantially ohmic contacts. The sample may be of N-type gallium arsenide of substantially uniform constituency which is doped in a manner known in the art to give a negative resistance characteristic as shown by curve 23 of FIG. 2A. For purposes of this application, the term two-valley device shall means any semiconductor device having a carrier velocity versus electric field characteristic of the general type shown in FIG. 2A. For N-type materials, the carrier velocity refers to electron velocity and for P-type materials it refers to hole velocity.

Figure 2A:
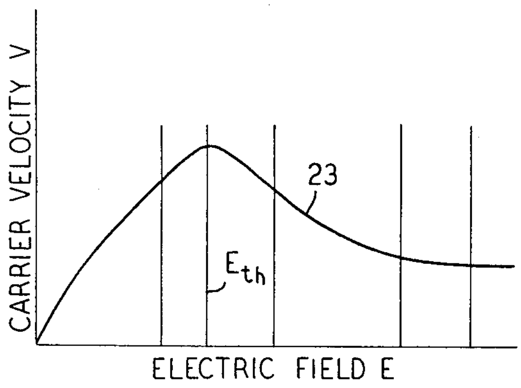
FIG. 2A is a graph of electron velocity v versus electric field E in the diode of the circuit of FIG. 1.
Figure 2B:
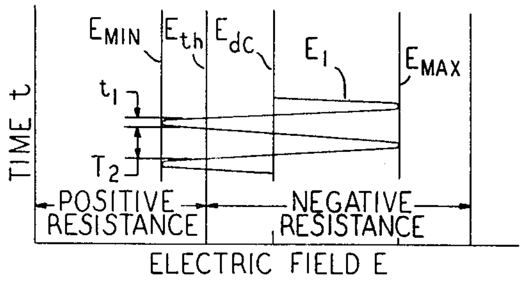
FIGS. 2B through 2D are graphs of time t versus electric field E in the diode of the circuit of FIG. 1 under various conditions of operation.

If the a-c source 11 were not connected to the circuit of FIG. 1, the *LSA* oscillator 12 would operate in substantially the manner described in the aforementioned Copeland application to generate a high frequency electric field $E_1$ in the diode having a relationship to the applied direct-current electric field $E_{DC}$ depicted in FIG. 2B. As shown in FIGS. 2A and 2B, the bias voltage across the diode $E_{DC}$ is higher than the threshold voltage $E_{th}$ at which negative resistance within the diode occurs. During the time interval $t_1$ of each cycle of $E_1$, the voltage in the diode extends below the threshold voltage $E_{th}$ into the positive resistance region of the diode, while during the remaining portion of the cycle $t_2$ it extends into the negative resistance region above $E_{th}$. The frequency of $E_1$ is determined by the oscillator resonant circuit, while the amplitude is a function of the load resistance $R_L$ of the circuit. In spite of the fact that the electric field $E_1$ extends into the positive resistance region, the gain of the device will exceed its attenuation of the following relationship is satisfied, $$\frac{1}{t_1+t_2}\int^{(t_1+t_2)} E_1\, v\, dt < E_{dc} V_a \qquad (2)$$

where the integral is taken over one cycle, $E_1$ is the electric field, $v$ is the carrier velocity, and $v_a$ is the average carrier drift velocity in the sample during oscillation. As pointed out in the Copeland application, traveling domains in the sample are prevented by making the time interval $t_2$ small enough so that substantial space-charge accumulation cannot occur during that time interval, and by making $t_1$ long enough to attenuate space-charge accumulation to prevent it from growing with succeeding cycles. To meet these requirements the following regulations should also be satisfied, $$\frac{ne}{\epsilon}\int^{(t_2)} |\mu|\, dt < 10 \qquad (3)$$

$$\frac{ne}{\epsilon}\int^{(t_1)} |\mu|\, dt > \frac{ne}{\epsilon}\int^{(t_2)} |\mu|\, dt \qquad (4)$$

where $(t_2)$ is the integral taken over the time period $t_2$, $\epsilon$ is the permittivity of the sample, $\mu$ is the differential mobility of the sample $dv/dE_1$, $e$ is the charge on a majority carrier, and $(t_1)$ is the internal taken over time period $t_1$.

In order to give the oscillating field $E_1$ sufficient amplitude to extend into the positive resistance region and to rise sharply into the negative resistance region, the circuit should be "lightly loaded;" i.e., the effective parallel load resistance should be fairly high. For a gallium arsenide diode, it is recommended in the Copeland application that the load resistance conform to the relationship, $$R_L < \frac{l}{n_0\, |\mu_2|\, eA} \qquad (5)$$

where $l$ is the length of the sample, $n_o$ is the doping level or average carrier concentration of the sample, $A$ is the area of the sample in a plane transverse to the drift current, and $\mu_2$ is the average mobility in a negative resistance region which is given by, $$|\mu_2| = \frac{1}{t_2}\int^{(t_2)} |\mu|\, dt. \qquad (6)$$

With fulfillment of the above conditions, oscillator circuit 12 operates in the LSA mode without the formation of traveling domains within the diode 16. The application of J. A. Copeland III, Ser. No. 612,598, filed Jan. 30, 1967, and assigned to Bell Telephone Laboratories, Incorporated points out that oscillations may be initiated either by transient effects or through the application of a burst of r-f energy.

Figure 2C:
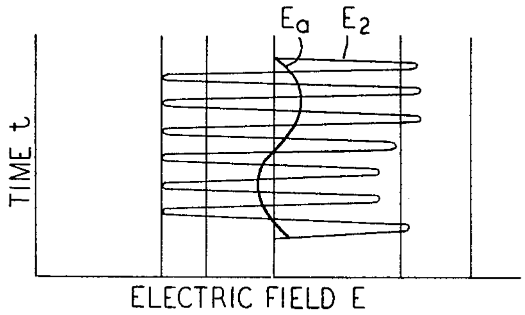

FIG. 2C shows the effect of the applied signal from signal source 11 of FIG. 1 on the oscillating field $E_{LSA}$ of the LSA oscillator. Assume first that the signal has a frequency $f_a$ giving rise to an electric field component $E_a$ superimposed on the d-c bias as shown in FIG. 2C. As is known, stable steady-state operation of a negative resistance oscillator requires that the magnitude of the negative resistance be equal to the magnitude of the negative resistance be equal to the magnitude of the load resistance. If the frequency $f_a$ of the applied field $E_a$ is sufficiently low with respect to the ratio of the frequency of oscillation $f_{LSA}$ to the quality factor of the resonant circuit of the oscillator, the amplitude of $E_{LSA}$ will change during each cycle to reach the steady-state condition at which the negative resistance equals the load resistance. This condition is depicted in FIG. 2C in which it can be seen that the amplitude of $E_{LSA}$ does change with the fluctuations of $E_a$. Since the circuit is stable, and $E_a$ is in the negative resistance region of the diode, $E_a$ will become amplified.

Figure 2D:
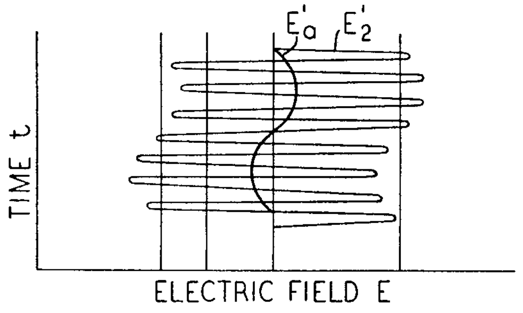

If, on the other hand, the frequency of $E_a$ is so high with respect to the oscillation frequency and the charge-storage capability of the resonant circuit that the oscillation frequency does not have time to reach a steady-state condition during each cycle, then the total negative resistance of the diode will not equal the load resistance and the applied field $E_a$ will not experience a net negative resistance. This condition is depicted in FIG. 2D in which the applied field $E'_a$ has such a high frequency with respect to the oscillation frequency of $E'_{LSA}$ that the amplitude of $E'_{LSA}$ ' cannot change with changes of $E'_a$. As a result, $E'_{LSA}$ extends into a region of low positive resistance and the component $E'_a$ is not amplified.

The condition for amplification of the applied field $E_a$ can be generalized as follows: if the frequency $f_a$ of the applied field $E_a$ is sufficiently low to permit LSA oscillatory mode energy in the resonant circuit to substantially change in amplitude during each cycle of the applied field $E_a$, then $E_a$ will be amplified. This in turn requires that the frequency $f_{LSA}$ of the oscillatory mode be sufficiently high, and the energy-storage quality factor of the resonant circuit be sufficiently low, with respect to the applied frequency $f_a$. These requirements for amplification of the frequency $f_a$ may be approximated by the relation, $$f_a \lesssim \frac{f_{LSA}}{Q} \qquad (7)$$

where $Q$ is the quality factor of the resonant circuit, which in turn is a measure of the energy-storage capability with respect to frequency of the circuit.

Presently known LSA mode oscillators using two-valley semiconductor diodes require a resonant circuit $Q$ which is greater than at least 5. From relationship (7) this limits the frequency $f_a$ that can be amplified, and as a practical matter, $f_a$ must be much smaller than the oscillation frequency $f_{LSA}$. For this reason, the circuit of FIG. 1 is more promising as a local oscillator, mixer, and amplifier circuit, then as a carrier frequency amplifier circuit.

Assume that the frequency of the signal from source 11 is equal to $f_{LSA} \pm f_a$. Since two-valley semiconductor diodes are non-linear, the applied signal will mix with the LSA frequency to give a difference frequency component $f_a$. If the difference frequency $f_a$ conforms with relationship (7), it will be amplified as described before. Transformer 14 and r-f choke 21 of FIG. 1 may be designed as a low-pass filter to pass only the amplified frequency $f_a$ to the load 13. Hence, the circuit of FIG. 1 may be useful in communications systems for down-converting and amplifying an incoming carrier wave having a higher frequency that could be detected by conventional crystal detectors.

Figure 3:
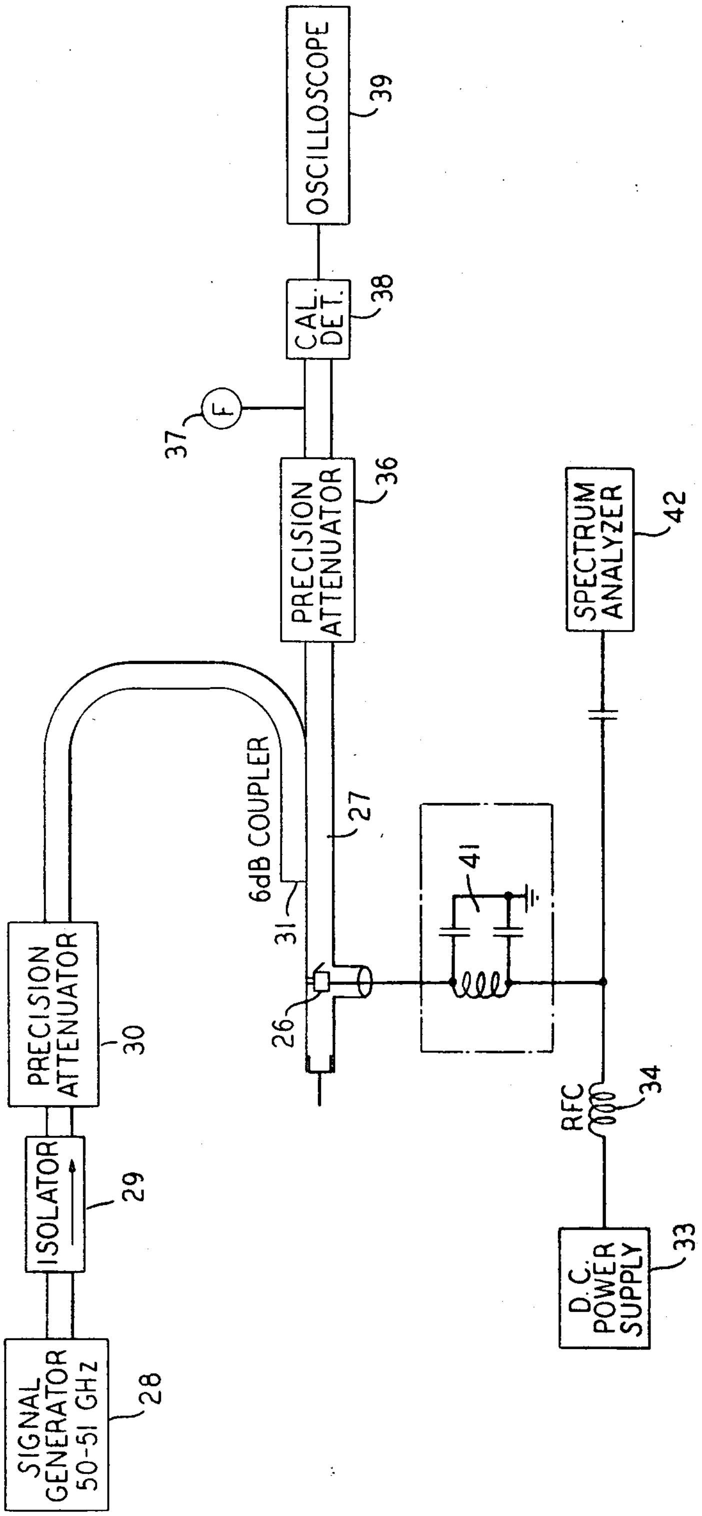
FIG. 3 is a schematic diagram of a microwave frequency embodiment of the circuit of FIG. 1.

FIG. 3 shows a schematic diagram of a microwave version of the circuit of FIG. 1 in which the two-valley semiconductor diode 26 is mounted in a waveguide 27, part of which constitutes the oscillator resonant circuit. An input signal from a source 28 is directed through an isolator 29, a precision attenuator 30 and a 6 dB coupler 31 to the waveguide 27. The diode 26 is biased by a d-c power supply 33 which is directed to the diode by way of a radio frequency choke 34. The LSA oscillator circuit includes a precision attenuator 36, a frequency meter 37, a calibrated detector 38, and an oscilloscope 39. The output circuit of the device includes a low-pass filter 41 and a spectrum analyzer 42.

The circuit shown in FIG. 3 has been built and tested to demonstrate mixing and amplification of the lower sideband frequency. The LSA oscillator circuit was designed to operate at a frequency $f_{LSA}$ of 50 gigaHertz with −10 dBm output power. The signal of 50 to 51 gigaHertz mixed with the LSA frequency to give outputs detected by the spectrum analyzer 42 at 30 megahertz and 180 megahertz with a gain of about 16 dB. The $Q$ of the oscillator resonant circuit was computed as being 100. The overall noise figure was found to be about 20 dB.

Figure 4:
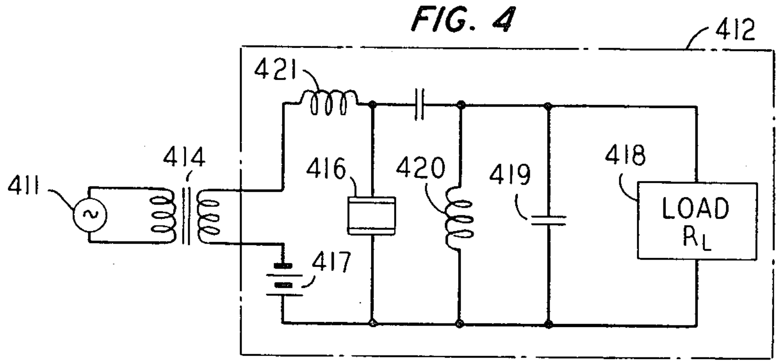
FIG. 4 is a schematic diagram of another embodiment of the invention.

Referring to FIG. 2C, since the amplitude of the LSA electric field $E_2$ varies with the applied field $E_a$, it is clear that $E_a$ could be used to amplitude modulate the LSA oscillation frequency. FIG. 4 shows an LSA oscillator circuit which has been modified to give amplitude modulation of the output in accordance with this principle. The last two digits of each of the reference numerals of the circuit of FIG. 4 designate components which have functions analogous to components of FIG. 1 having the same two digit reference numeral. The components within the dotted line 412 constitute an LSA oscillator circuit. A modulating signal from source 411 having a frequency $f_a$ that corresponds to relationship (7) is applied across the diode 416. This frequency modulates the amplitude of the oscillatory output as depicted in FIG. 2C, and this usable output is delivered to the load 418 having a load resistance $R_L$ which corresponds to the load resistance $R_L$ of FIG. 1. It is, of course, contemplated that amplitude variations of the modulating signal constitute information to be transmitted.

Figure 5:
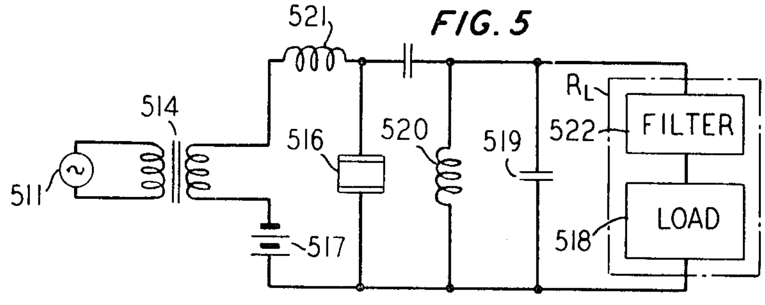
FIG. 5 is a schematic diagram of still another embodiment of the invention.

Since the diode 416 is nonlinear, the applied frequency $f_a$ mixes with the oscillating frequency $f_{LSA}$ to give an upper sideband frequency $f_a + f_{LSA}$. If this frequency is derived at the load to the exclusion of other component frequencies, the circuit operates as a frequency up-converter, as shown in FIG. 5. In FIG. 5, a filter 522 is included in the output circuit of the LSA oscillator to filter out all frequencies except the sum frequency. With frequency $f_a$ being delivered by source 511, the frequency $f_a + f_{LSA}$ is delivered to the load 518, and the circuit operates as a frequency up-converter. If the frequency $f_a$ complies with relationship (7) the sum frequency is amplified, and the circuit constitutes an up-converter and an amplifier. Alternatively, the frequency $f_{LSA} - f_a$, which may also be considered to be sum frequency, may be derived.

Figure 6:
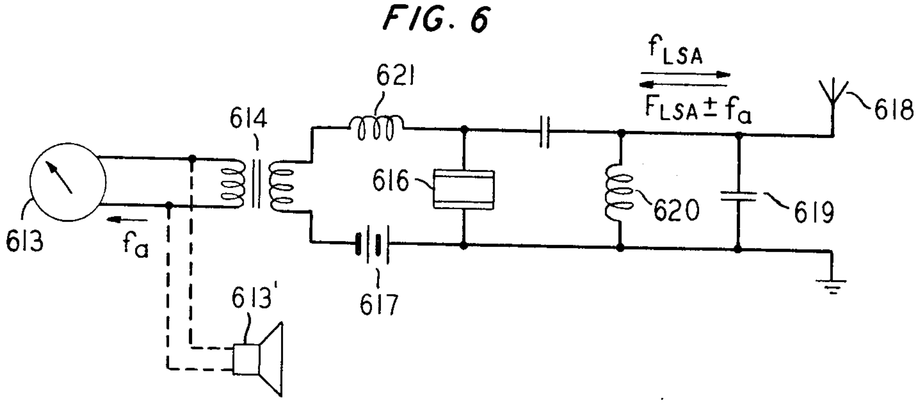
FIG. 6 is a schematic representation of a Doppler-effect radar in accordance with an embodiment of the invention.

FIG. 6 shows how the circuit of FIG. 1 can be modified to provide a simple and inexpensive Doppler-effect radar. The LSA oscillator load resistor is replaced by a transmit-received antenna 618 which radiates the oscillatory frequency $f_{LSA}$. The radiated energy is reflected from a distant object or target and returns to the antenna with a frequency $f_{LSA} \pm f_a$ which is shifted in frequency by the Doppler-effect according to the velocity of the target. If the target is moving away from the antenna, the reflected frequency will be lower than $f_{LSA}$, while if it is moving toward the antenna, it will be higher than $f_{LSA}$.

As in the circuit of FIG. 1, the frequency $f_{LSA} \pm f_a$ is mixed in the diode to generate the difference frequency $f_a$ which is transmitted via a transformer 614 to a load. In this case the load may be a frequency meter 613 which may be appropriately calibrated to indicate the velocity of the target. Since in most cases the frequency $f_a$ will be an audio frequency, it can alternatively be used to drive a speaker 613'. This may be useful, for example, as a burglar alarm to give an aural signal of any moving object within a target area.

Figure 7:
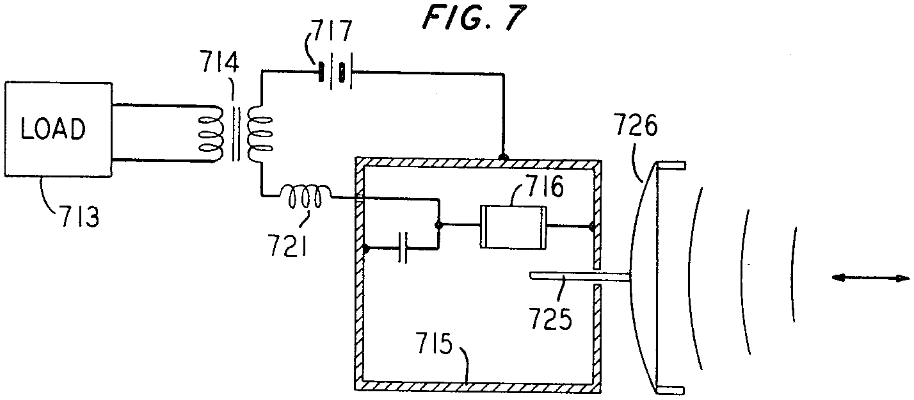
FIG. 7 is a schematic illustration of microphone apparatus in accordance with an embodiment of the invention.
Figure 8:
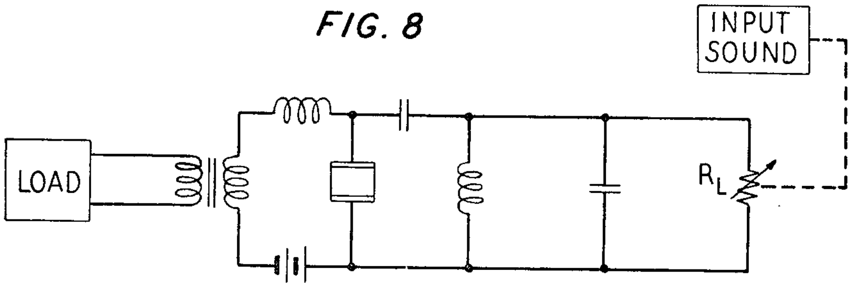
FIG. 8 is a schematic diagram of the microphone apparatus of FIG. 7.

FIGS. 7 and 8 show how the amplitude modulation feature of the invention can be used to provide a simple and inexpensive microphone. An LSA oscillator comprises a diode 716 biased by a voltage source 717 and contained within a microwave cavity resonator 715. A conductive plunger 725 connected to a sound-responsive diaphragm 726 extends into the cavity resonator and vibrates along with the diaphragm to modulate the resistive loading of the cavity. This in turn modulates the quality factor Q of the resonator and therefore the amplitude of the output oscillations. The amplitude modulated energy is delivered by transformer 714 to the load 713; in this case the transformer does not filter out any of the frequency components and the waveform shown as $E_2$ in FIG. 2C is transmitted to the load. However, as a practical matter, any waveguide used for transmitting $E_2$ would filter out the low frequency component $E_a$.

FIG. 8 is an equivalent circuit of the apparatus of FIG. 7 and is presented to illustrated that the varying penetration of plunger 725 into resonator 715 is the equivalent of varying the load $R_L$ of the LSA oscillator. The input sound of course has the frequency $f_a$ which must comply with relationship (7).

In summary, my invention is based on the discovery that an LSA oscillator will present a negative resistance to a limited band of applied frequencies $f_a$ which are sufficiently low to permit LSA oscillatory mode energy in a resonant circuit to change amplitude each cycle. As a result, the LSA oscillator circuit can be operated as a direct amplifier of frequency $f_a$ or as an amplitude modulator circuit. Because the two-valley semiconductor diode is nonlinear, the circuit can also be operated as a combination oscillator, mixer, and amplifier for generating and amplifying either upper or lower sideband frequencies. In a radar apparatus, the oscillator can be used as the primary microwave source as well as a detector and amplifier of incoming waves. The various embodiments shown and described are intended, however, only to be illustrative of the principles of the invention; various other arrangements may be made by those skilled in the art without departing from the spirit and scope of the invention.

What is claimed is:

1. In a circuit of the type comprising a two-valley semiconductor device connected to a d-c voltage source, a load resistance, and a resonant circuit having a characteristic frequency and a quality factor Q, the parameters of the semiconductor device, voltage source, load resistance, and resonant circuit being arranged to give oscillation in the device in the LSA mode, the improvement comprising:

means for applying to said semiconductor device alternating-current electrical energy at a frequency $f_a$ which is sufficiently low to modulate the amplitude of LSA oscillatory mode energy;

said energy applying means comprising a sound-responsive diaphragm and means connected to the diaphragm for varying the quality factor Q of the resonant circuit.

2. The improvement of claim 1 wherein:

the resonant circuit comprises a cavity resonator;

and the varying means comprises a conductive plunger extending at one end into the cavity resonator.

3. In combination:

means for generating an oscillatory output frequency $f_{LSA}$ and for amplitude modulating said output frequency comprising a two-valley semiconductor device, a d-c voltage source, a load, and a cavity resonator having a characteristic frequency $f_{LSA}$ and a quality factor Q, the parameters of the semiconductor, voltage source, load, and cavity resonator being arranged to give oscillation in the device in the LSA oscillatory mode at the frequency $f_{LSA}$, and means for applying a modulating signal of frequency $f_a$ to the semiconductor device;

the frequency $f_a$ being sufficiently low to permit LSA oscillatory mode energy in said resonant circuit to change in amplitude during substantially each cycle of $f_a$ in accordance with the frequency $f_a$, whereby the output oscillatory energy delivered to the load is amplitude modulated;

the modulating signal applying means comprising sound-responsive means for varying the quality factor Q of the resonator.

4. The combination of claim 3 wherein:

the sound-responsive means comprises a diaphragm connected to a conductive plunger one end of which extends into the cavity resonator.

* * * * *